(12) United States Patent
Young

(10) Patent No.: US 7,598,772 B2
(45) Date of Patent: Oct. 6, 2009

(54) SIGNAL DRIVER HAVING SELECTABLE AGGREGATE SLEW RATE TO COMPENSATE FOR VARYING PROCESS, VOLTAGE OR TEMPERATURE CONDITIONS

(75) Inventor: Brian D. Young, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/773,476

(22) Filed: Jul. 5, 2007

(65) Prior Publication Data

US 2008/0157843 A1 Jul. 3, 2008

Related U.S. Application Data

(60) Provisional application No. 60/882,682, filed on Dec. 29, 2006.

(51) Int. Cl.
*H03K 19/094* (2006.01)
*H03K 19/0175* (2006.01)
*H03B 1/00* (2006.01)

(52) U.S. Cl. .......................... 326/83; 326/27; 327/108; 327/138

(58) Field of Classification Search .................. 326/21, 326/27, 31, 32, 68, 82, 83, 86, 87, 112, 115; 327/108, 109, 140, 170, 333
See application file for complete search history.

(56) References Cited

U.S. PATENT DOCUMENTS

| 6,744,287 | B2 * | 6/2004 | Mooney et al. | 327/108 |
| 7,176,729 | B2 * | 2/2007 | Hayashi et al. | 327/108 |
| 2005/0127967 | A1 * | 6/2005 | Allen | 327/170 |
| 2007/0069784 | A1 * | 3/2007 | Shin et al. | 327/170 |

* cited by examiner

*Primary Examiner*—Rexford N Barnie
*Assistant Examiner*—Dylan White
(74) *Attorney, Agent, or Firm*—William B. Kempler; Wade J. Brady, III; Frederick J. Telecky, Jr.

(57) ABSTRACT

A signal driver having a selectable aggregate slew rate, a method of driving a signal driver and a signal driver incorporating the driver or the method. The driver includes plural partial drivers configured to output signals based on time constants established by corresponding plural time-delay networks associated therewith. The signal driver further includes a slew rate selector coupled to the plural time-delay networks and configured to provide a common signal thereto to cause the plural time-delay networks to achieve target time constants, the target time constants causing the output signals to be generated such that the signal driver achieves the selectable aggregate slew rate.

21 Claims, 5 Drawing Sheets

SIGNAL DRIVER HAVING SELECTABLE AGGREGATE SLEW RATE TO COMPENSATE FOR VARYING PROCESS, VOLTAGE OR TEMPERATURE CONDITIONS

CROSS-REFERENCE TO PROVISIONAL APPLICATION

This application claims the benefit of U.S. Provisional Application No. 60/882,682 entitled "An Off-Chip Driver Topology to Achieve Constant Slew Rate Under Varying Process, voltage, and Temperature Conditions" to Brian D. Young, filed on Dec. 29, 2006, which is commonly assigned with the invention and incorporated herein by reference as if reproduced herein in its entirety.

TECHNICAL FIELD OF THE INVENTION

The invention is directed, in general, to controlling a slew rate of a driver, and more specifically, to generating a selectable aggregate slew rate to compensate for varying fabrication process, voltage and temperature conditions.

BACKGROUND OF THE INVENTION

A single push-pull metal-oxide-semiconductor field-effect transistor (MOSFET) pair has typically been used to drive a signal on and off. Unfortunately, the impedance of the push/pull pair is dependent upon variations in fabrication process, voltage and temperature conditions.

To address this problem, one approach was developed in which signal drivers were divided into multiple (e.g., five) separate drivers. The current outputs of the signal drivers were aggregated to generate a desired signal output. Factors of two distinguished the currents of each of the signal drivers, which allowed a binary code to drive the signal drivers to produce the desired output current for any given fabrication process, voltage and temperature. However, this "N separate signal driver" approach had its own problems. For instance, the impedance of the signal driver as a whole tended to change momentarily and dramatically (giving rise to what is colloquially called a "glitch") as the separate signal drivers switched on and off when compensating for changes in fabrication process, voltage and temperature.

The switching speed, or slew rate, of the driver can be adjusted by further subdividing the driver into M equal sections (e.g., 4) and delaying the switching of each. However, grounding capacitors were required at the output of the driver to help slow down edges. Unfortunately, these grounding capacitors occupied valuable area on an integrated circuit ("IC") chip.

An alternative, "digital thermometer" approach to a signal driver was also developed. In this approach, the outputs of an array of separate drivers (perhaps 60 to 100) of equal current capacity were coupled in parallel and enabled or disabled to produce the desired output current for any given fabrication process, voltage and temperature. Unlike the binary coded driver, the thermometer coded driver does not glitch when changing the current drive strength when compensating for changes to the fabrication process, voltage, and temperature.

The slew rate control mechanism applied to the binary coded driver, where the driver is further subdivided, is not practical to thermometer coded drivers because of the large number of resulting circuits and lack of area on the IC to implement the scheme.

Process corners are parametric extremes, such as physical dimension, uniformity and chemical composition, evident in a given population of fabricated ICs. The process corners define the envelope within which the population of ICs behaves. The corner of behavior that leads to a fastest slew rate occurs at a high voltage, low temperature corner of operation and is therefore known as the "fast" or "strong" corner. Likewise, the corner of behavior that leads to the slowest slew rate occurs at a low voltage, high temperature corner and is therefore known as the "slow" or "weak" corner. Also, the strength of the silicon itself has an affect on the determination of whether it is the "fast" or "slow" corner.

In circuit design, one should design for the worst-case scenario, which in this context means proper operation even at the process corners. A circuit designer therefore needs to take into account the various possible slew rates of an IC in either its "strong" or "weak" corner.

Accordingly, what is needed in the art is a signal driver that has a selectable aggregate slew rate to compensate for varying fabrication process, voltage or temperature conditions.

SUMMARY OF THE INVENTION

To address the above-discussed deficiencies of the prior art, one aspect of the invention provides a signal driver having a configurable slew rate. In one embodiment, the signal driver includes: (1) plural partial drivers configured to generate driver signals based on time constants established by corresponding plural time-delay networks associated therewith and (2) a slew rate selector coupled to the plural time-delay networks and configured to provide a common signal thereto to cause the plural time-delay networks to achieve target time constants, the target time constants causing the partial drivers to generate driver signals such that the signal driver achieves the selectable aggregate slew rate.

Another aspect of the invention provides a signal driver system having a signal driver with a selectable aggregate slew rate. In one embodiment, the signal driver includes: (1) plural partial drivers configured to generate a driver signal based on time constants established by corresponding plural time-delay networks associated therewith and (2) a slew rate selector coupled to the plural time-delay networks and configured to provide a common signal thereto to cause the plural time-delay networks to achieve target time constants. The target time constants cause the partial drivers to be activated such that the signal driver achieves the selectable aggregate slew rate, a first time-delay network of the plural time-delay network including: (2a) at least one switch, (2b) at least one capacitor, wherein the capacitor is grounded when the switch is closed and (2c) a resistive element coupled to a sensor of a signal slice of the plural partial drivers and also to the at least one capacitor. The resistive element is also coupled to a prior resistive element, each of the target time constants being based on the prior resistive element and a closure state of the switch.

Yet another aspect of the invention provides a method of controlling an aggregate slew rate. In one embodiment, the method includes: (1) receiving slew rate control data, (2) configuring a target time constant as a function of the slew rate control data, (3) delaying an introduction of a first partial driver as a function of the target time constant and (4) delaying an introduction of a second partial driver as a function of both the target time constant and an introduction of the first partial driver.

The foregoing has outlined alternative aspects and embodiments of the invention so that those skilled in the pertinent art may better understand the detailed description of the invention that follows. Additional aspects and embodiments of the invention will be described hereinafter that form the subject of the claims of the invention. Those skilled in the pertinent art should appreciate that they can readily use the disclosed aspects and embodiments as a basis for designing or modifying other structures for carrying out the same purposes of the invention. Those skilled in the pertinent art should also realize that such equivalent constructions do not depart from the scope of the invention.

BRIEF DESCRIPTION OF THE DRAWINGS

For a more complete understanding of the invention, reference is now made to the following descriptions taken in conjunction with the accompanying drawings, in which.

DETAILED DESCRIPTION

Figure 1:
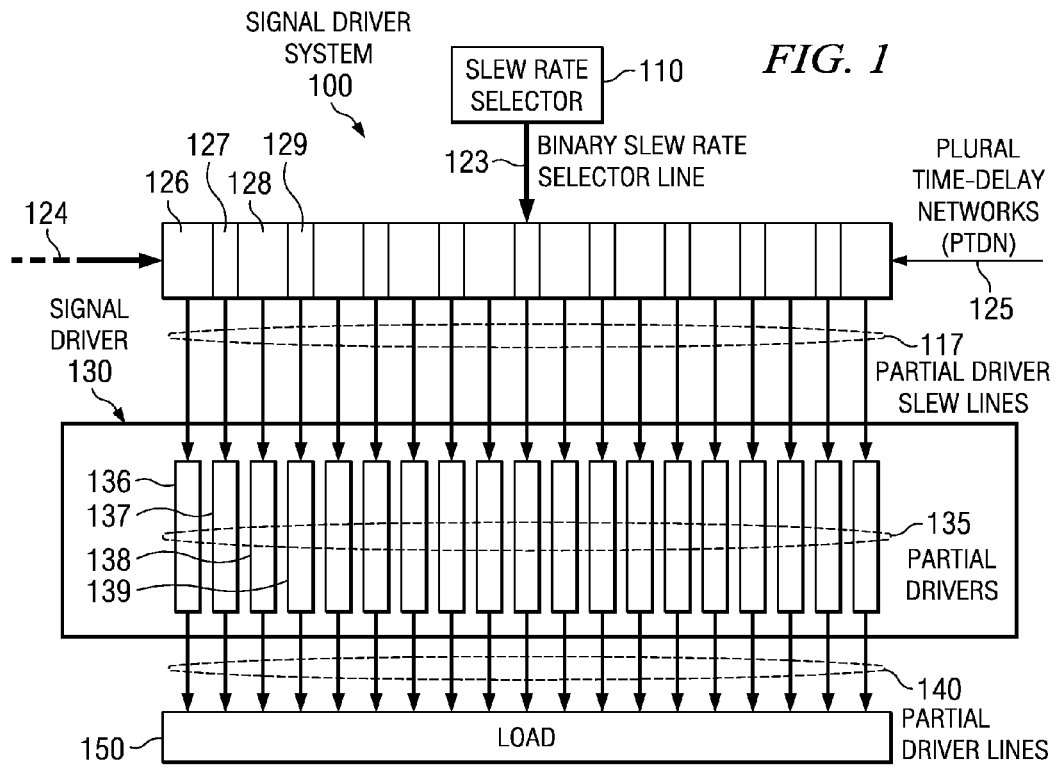
FIG. 1 illustrates a diagram of an embodiment of a system that controls a slew rate through adjustment of an equivalent ("Thevenin") turn-on resistance.

FIG. 1 illustrates a signal driver system 100. The signal driver system 100 includes a slew rate selector ("SRS") 110 that selects an aggregate slew rate. In the present Application, "aggregate" generally refers to the overall effect of selecting, introducing and/or removing partial drivers, perhaps distributed over a selected time period, as will be described below. This selection of an aggregate slew rate by the signal driver system 100 may occur, for instance, when compensating for PVT variations.

As used herein, an "edge rate" is defined as the time it takes to make a transition from an off state to an on state at a given voltage value. A "slew rate" is defined as a voltage transition of the signal driver system 100 divided by its edge rate. In one example, if 1.5 volts are transition in 2 nanoseconds, the "edge rate" is 2 nanoseconds and the slew rate is 0.75 volts/nanosecond. A "target edge rate" may be generally defined as a selected edge rate to be output by the signal driver system 100. Generally, the SRS 110 selects an aggregate slew rate, and this is expressed by the enablement or disablement of partial drivers 135, such as partial drivers 136, 137, 138, 139, and so on of a signal driver 130.

A "partial driver" may be generally defined as a driver that drives a signal and has a selected resistance, wherein two or more partial drivers are employable within the signal driver 130. A load 150 may be driven by a single "partial" driver; however, the time involved to achieve an upper rail voltage can be substantial. The more partial drivers employed, the faster the upper rail output voltage can be realized, and hence the faster an aggregate slew rate.

In the signal driver system 100, the partial drivers 135 are coupled in parallel within the signal driver 130 to a load 150. Hence, the resistances of the partial drivers are also coupled in parallel to the load 150. Therefore, the more partial drivers 135 that are enabled to drive a signal to the load 150, the lower an equivalent "Thevenin" turn-on resistance is for an entire signal driver 130, and therefore the faster the slew rate of the signal driver 130 becomes. In some embodiments of the signal driver system 100, the signal driver 130 is segmented into about 20 partial drivers 135. This fine granularity allows the output edge to be substantially smooth.

In some embodiments, the number of partial drivers can be sixty to one hundred. In the strong corner, as few as 20 partial drivers may be needed to reach the required output impedance.

For instance, assuming the signal driver 130 has 50 ohm equivalent Thevenin turn-on resistance with all of the partial drivers 135 enabled (assuming 20 slices), the signal driver 130 has 100 ohms equivalent Thevenin turn-on resistance with 10 partial drivers 135 enabled; 200 ohms Thevenin equivalent resistance with five partial drivers 135 enabled, and 1000 ohms equivalent resistance with only one partial driver 135 enabled. Equivalent resistance of the signal driver 130, as a function of the number of enabled partial drivers 135, affects slew rates of the signal driven by the signal driver 130, as will be detailed below, thereby generating an aggregate slew rate.

In measuring slew rates, one figure of merit is a "10%-90%" rise time (i.e., the length of time for an output voltage takes to rise from 10% of its final voltage to 90% of its final voltage), which is calculated as being approximately 2.2*R*C, with "R" being resistance, and "C" being capacitance. In the signal driver system 100, if all of the partial drivers 135 are enabled at "turn on" and the signal driver 130 is driving a purely capacitive ("C") load 150, a 50 ohm signal driver 130 driving a 5 picofarad load 150 has a rise time of 0.55 nanoseconds. The voltage output by signal driver 130 will swing from 0.0V to 1.5V in 0.55 nanoseconds if a power supply of the signal driver 130 is 1.5 volts.

In a second example, for ease of illustration, half the partial drivers 135 of the signal driver 130 turn on at time "0" and half at time "5 nanoseconds." With half of the partial drivers 135 enabled of the signal driver 130, the signal driver 130 equivalent turn-on impedance is now 100 ohms, and the "10-90" rise time is 1.1 nanoseconds. Therefore, the signal driver 130 will actually fully switch from 0.0 to 1.5V in 1.1 nanoseconds.

In this second example, when the second half of partial drivers 135 of the signal driver 130 turns on at 5 nanoseconds, these second half of the partial-drivers have, at best, a negligible effect upon the load 150, because the signal driver 130 is already fully switched to outputting the full output signal voltage at 1.1 nanoseconds. This means that the second half of the partial drivers 135 of the signal driver 130 would have been turned on too late to have any substantial effect on the slew rate of the signal supplied to load 150.

In a third example, the turn-on of the second-half of the partial drivers 135 is delayed by 0.5 nanoseconds. In this third example, ten of the partial drivers 135 are approximately halfway through switching to fully outputting an output signal driver "on" signal when, in the second half of the signal driver 130, the partial drivers 135 eleven through twenty, turn on. The signal driver 130 then completes the last half of the switching in about 0.25 ns (0.55 ns/2 since it only has half as far to go). The total transition time from off to on would then be about 0.75 nanoseconds, and the slew rate has been slowed from 0.55 nanoseconds to about 0.75 nanoseconds. However, in this example, the edge could be very uneven since the signal driver 130 is segmented into only two functional pieces (i.e., the first half of partial drivers 135 turning on, then the second half of partial drivers 135 turning on sometime later).

A binary slew rate selector line 123 couples the SRS 110 to a plural time-delay networks ("PTDN") 125. Each time-delay network of the PTDN 125 is coupled to its own partial driver 135 of a signal driver 130 by its corresponding partial driver slew line 117. The signal driver 130 is also coupled to the load 150 by partial driver lines 140.

A common signal is provided by the SRS 110 over binary slew rate selector line 123 to the PTDN 125 to cause the PTDN 125 to achieve a common target time constant. The common target time constant, in turn, causes driver signals to be generated by the partial drivers 135 at the behest of the PTDN 125 such that the signal driver system 100 achieves the aforementioned selectable aggregate slew rate.

In the illustrated embodiment, the PTDN 125 includes time-delay networks designated 126, 127, 128 129, as well as other time-delay network that are not numbered. Each time-delay network 126-129 is sequentially coupled to at least one other time-delay network, as will be described in more detail in FIG. 2B, below.

The SRS 110 targets and programs a common time constant for PTDN 125. Then, after a reception of a "driver on" signal 124, which signals to the signal driver system 100 that a driver signal is to be delivered to the load 150, each time-delay network 126-127, etc., sequentially applies a "partial driver on" signal ("PD on") over its signal slice slew line 117 to its own corresponding partial driver 136-139, etc., as will be described below. In some embodiments, the "driver on" signal 124 is a clock or data pulse.

In the signal driver system 100, the first time-delay network 126 conveys its own corresponding "PD on" signal to its corresponding partial driver 136 after an elapse of time corresponding to the target time constant after the reception of the "driver on" signal 124, then conveys the "driver on" signal to the next time-delay network 127 in the PTDN 125. After each elapse of time corresponding to the target time constant, each partial driver turns on its own partial driver through conveyance of the "PD on" signal to its own partial driver, then conveys the "driver on" signal to the next time-delay network in the PTDN 125.

For example, in the PTDN 125, a time-delay network, such as the time-delay network 126, applies a "PD on" signal to its corresponding partial driver 136 after an elapse of time, (which corresponds to the target time constant received from the SRS 110) has occurred. Upon the elapse of time corresponding to the time constant after reception of the "driver on" signal 124, time-delay network 126 then conveys the "driver on" signal to time-delay network 127, and so on.

Then, in the PTDN 125, the time-delay network 127 applies the "PD on" signal to its corresponding partial driver 137 after an elapse of time corresponding to the target time constant has again occurred. In other words, the partial driver 136 is turned on after this elapse target time constant, a reiteration of the target time constant. In other words, two elapses of time, each elapse of time corresponding to the target time constant, has occurred before an application of the "PD on" on signal to its corresponding PSS 137 from time delay network 127.

Upon the elapse of the time constant associated with time-delay network 127, the time-delay network 127 conveys the "driver on" signal to time-delay network 128, and so on. This chronologically sequential application of a "PD on" signal for a selected, corresponding partial driver is delayed by any previous applications of a "PD on" signal for any previous partial driver on signal. This sequential application of a "PD on" signal then leads to the selectable aggregate slew rate.

The delay in propagating the "driver on" signal 124 is selected and targeted by the SRS 110. In the SRS 110, a target time constant can be programmable. As discussed above, controlling the timing of distinct "PD on" signals can generate a selectable aggregate slew rate for the signal driver 100. The partial drivers 136 are coupled in parallel to provide a variable resistance source to a load 150.

For example, the partial driver 136 is introduced as a signal driver to the load 150 after a first elapse of the target time constant, the partial driver 137 is introduced as a signal driver to the load 150 after a second elapse of the target time constant, the partial driver 138 is introduced as a signal driver to the load 150 after a third elapse of the target time constant, and so on. Selecting the target time constant for the PTDN 125 therefore selects the aggregate slew rate of the signal driver 130.

Selecting the aggregate slew rate of the signal driver 130 can be advantageous, in that PVT variations can be compensated for. As the signal driver 130 can have a variable aggregate slew rate, a slew rate may be more precisely tailored for the requirements and the tolerances of the process corner.

Figure 2A:
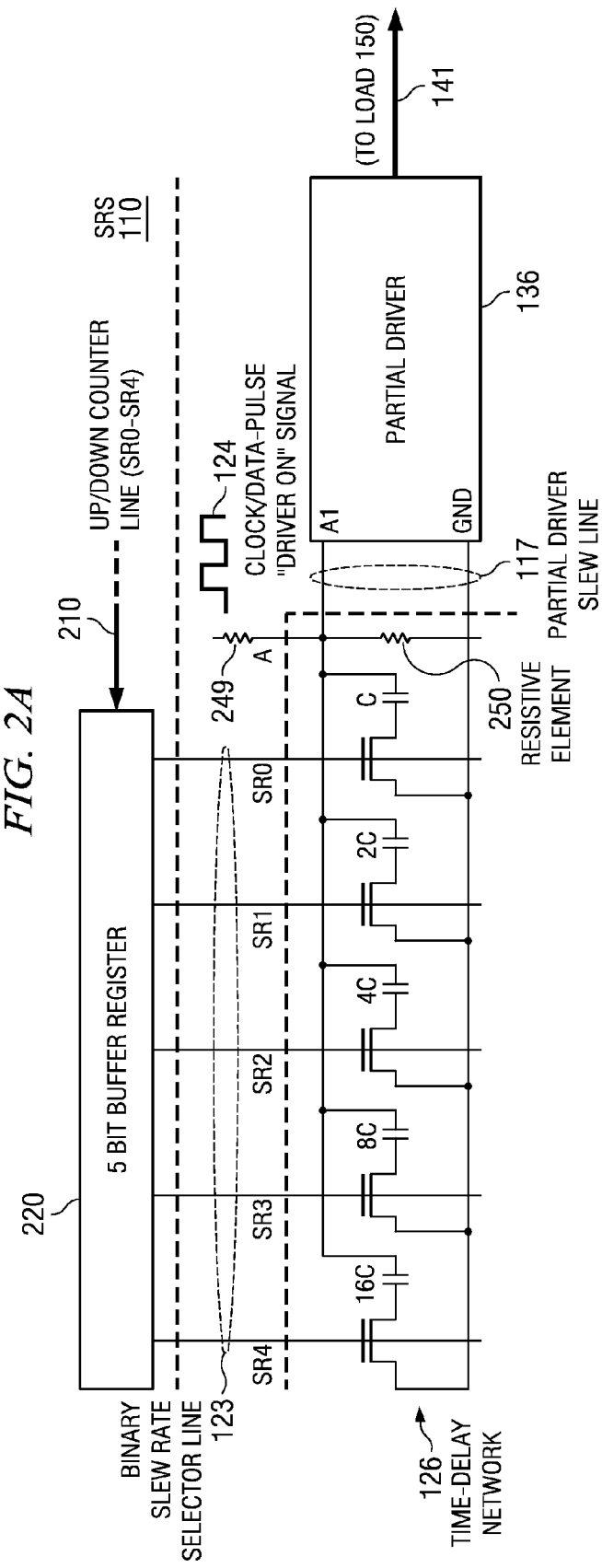
FIG. 2A illustrates a diagram of an embodiment of a time-delay network that introduces a signal to a "partial-driver" through employment of a target time constant.

FIG. 2A illustrates an embodiment which delineates details and couplings of the SRS 110, the time-delay network 126, and the partial driver 136 in more detail.

The SRS 110 is illustrated as including a five-bit buffer register 220 coupled to an up-down counter line 210. A selection of the common signal, which represents the target time constant, to the time-delay network 126 occurs due to a digital programming of the five-bit register 220 by the SRS 110. In the illustrated embodiment, the SRS 110 is programmed to select the common signal, which represents the target time constant, and the five-bit register 220 is to convey the common signal (corresponding to the target time constant) as data to the time-delay network 126.

The data, conveyed as a target signal through binary slew rate selector line 123 through data lines SR0-SR4, is then converted to an equivalent target time constant by the time-delay network 126, as will be described below. In some embodiments, the up/down counter line 210 modifies the common signal, representing the target time constant.

The time-delay network 126 also includes at least one switch. In the illustrated embodiment, each switch is a MOSFET that is opened or closed by its corresponding (SR4-SR0) signal, received from the register 220. The time-delay network 126 further includes at least one capacitor coupled to the at least one switch, wherein the capacitor is grounded if its coupled switch is closed; otherwise the capacitor is floating. The GND input of the partial driver 136 is coupled to the anode of each capacitor. The time-delay network 126 further includes a resistive element (e.g., a resistor) 250 coupled to a sensor input node A1 of the partial driver 136 and also to the at least one capacitor. The resistive element 250 also connects to a node "$A_n$" of a next partial driver.

In the illustrated embodiment, the target time constant is a function of a resistance of the resistive element 249 of a prior partial driver (not illustrated) and whether the at least one switch is closed, which would couple the prior resistive element 250 to ground through a capacitor corresponding to the closed switch. In some embodiments, the target time function is a function of the resistance of the resistive element, and whether the resistive element is coupled to ground through a plurality of capacitors corresponding to a closed switch.

In the illustrated embodiment, the partial driver 136 is introduced (i.e., "turned on") after a rise of a voltage occurs at the prior resistive element 249 of a previous time-delay network 126, and the resistive element 250 is used by a time-delay network 127. More specifically, the partial driver 136 is introduced after a lapse of time equal the target time constant, as the target time constant is a function of both the resistance of a prior resistive element, such as prior resistive element 249 of a previous time delay network and the equivalent coupled capacitance or capacitances coupling input node A1 to ground, if any.

In the illustrated embodiment of FIG. 2A, the time-delay network 126 further includes a plurality of switches and a plurality of capacitors, wherein each capacitor of the plurality of capacitors is grounded by a corresponding switch of the plurality of switches if its corresponding switch is closed wherein the selectable time constant is a function of the resistance of the prior resistive element 249 and whether a given switch of the plurality of switches is closed.

In the illustrated embodiment of FIG. 2A, a plurality of capacitors are coupled in parallel to one another when all of the switches are closed. The plurality of capacitors has a first capacitor and a second capacitor, and wherein the second capacitor has substantially twice the capacitance of the first capacitor. Generally, capacitors coupled in parallel add serially to a capacitance value. An increase in capacitance value would increase the target time constant associated with the time-delay network 126, which would extend the delay time of an introduction of the partial driver 136 from a reception of the "driver on" signal at the time-delay network 126.

In other words, the slew rate of an introduction of the individual partial driver 136 could be increased as a function of the coupling or uncoupling of the various capacitors. A target time constant of a given time-delay network is employable to vary an introduction time of its respective partial driver 136 to vary the aggregate slew rate. In at least some embodiments, each time-delay network 125 has the same target time constant.

In the illustrated embodiment, there are five capacitors, with a value of "C," "2 C," "4 C," "8 C," and "16 C." Each of these capacitors may or may not be coupled to ground as a function of its corresponding data received from the register 220.

Therefore, assuming that at least one capacitor is grounded in FIG. 2A, a resistive-capacitive ("RC") network is formed. Generally, in order for the partial driver 136 to output a drive signal, a predetermined voltage differential first occurs between input node A1 of the partial driver 136 and the GND node of the partial driver 136. However, upon an application of a voltage on node "A" of the time-delay network 126, an increase of the voltage at node A1 of the partial driver 136 will be delayed as a function of the target time constant. Therefore, the partial driver 136 will be delayed in providing a signal as a function of the targeted time constant. As mentioned above, the resistive element 250 is coupled to the capacitors but is not coupled to ground. Therefore, the voltage at node A1 follows the voltage at node A.

In the illustrated embodiment, the target time constant is a function of both the equivalent capacitance of the 5 capacitors and the resistance of the prior resistive element 249. For instance, if there is an equivalent capacitance of 14 "C" ("C" perhaps being measured in picofarads), and a resistance of 100 ohms, there is an equivalent time constant of $1.4 \times 10^{-10}$ seconds. In other words, after an application of the "driver on" signal 124, the partial driver 136 is delayed in applying power to the load 150 (i.e., there is a delay of the partial driver 136 being "introduced") due to the target time constant as conveyed from the register 220.

Figure 2B:
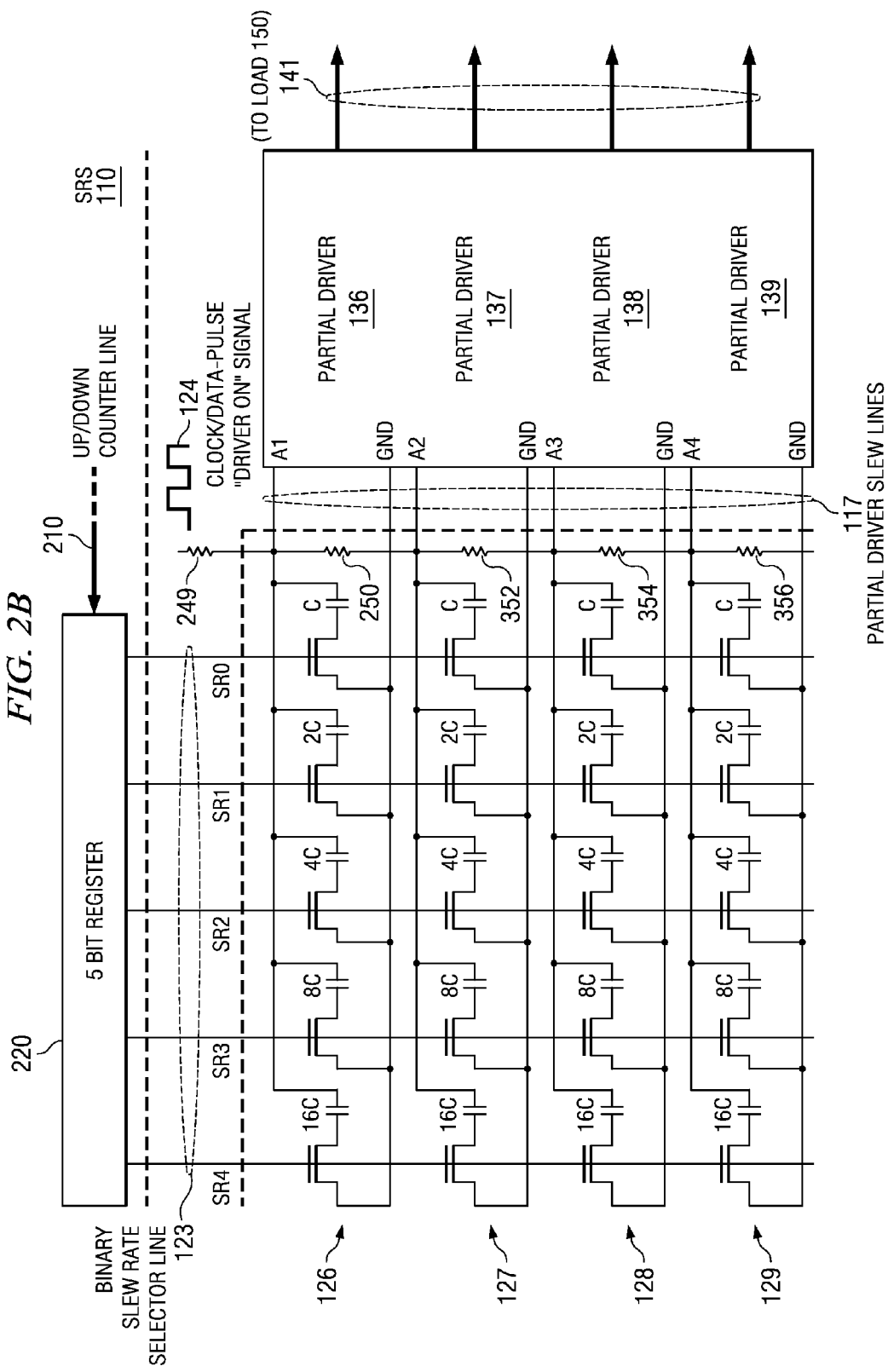
FIG. 2B illustrates a diagram of an embodiment of plural time-delay networks that introduce a plurality of signals to a plurality of partial drivers to create a selectable aggregate slew rate as a function of an overall equivalent ("Thevenin") turn-on resistance.

FIG. 2B illustrates plural partial drivers 136-139 with their respective input nodes A1-A4, and with their respectively coupled GND nodes. In FIG. 2B, the five-bit register 210 programs each time-delay network 126-129 with a common signal, including data to set the common target time constant.

Upon an application of the "driver on" signal 124, the voltage at input node A1 rises as a function of an elapse of the target time constant, as defined by the data conveyed by the five-bit register 220. After an elapse of the targeted time constant and its corresponding capacitive network is charged, a voltage corresponding to the "driver on" signal is then applied through resistive element 250 to the node A2 of partial driver 137.

However, due to the targeted time constant, associated with time-delay network 127, the voltage at the node A2 does not rise until its corresponding capacitive network is also charged. Therefore, a time delay, which is based on the targeted time constant and any previous delays, also delays the partial driver 137 from applying its output driver signal. The time delay of the introduction of the output driver signal of partial driver 137 is twice the time delay of the partial driver 136. This is because the partial driver 136 awaits the A1 and GND nodes to be sufficiently differentiated by voltage, but the partial driver 137 awaits for the node A2 and GND to be sufficiently differentiated by voltage, which occurs after the A1 and GND nodes are sufficiently differentiated by voltage.

In other words, the voltage at a resistive element 352 at the node A2, which contributes to the target time constant for the time-delay network 128, does not begin rising until a lapse of time corresponding from the target time constant at after node A1 has started to rise. This process is similar at resistive elements 354, 356, corresponding to the nodes A3 and A4, respectively. In at least some embodiments, resistive and/or capacitive values are selected so that a first target time constant and a second target have the same value.

However, the node A2 can not be differentiated by a voltage differential between the node A2 and GND until the node A1 is already differentiated by voltage differential between the node A1 and GND. In other words, for the voltage of the node A2 node to introduce partial driver 137, the selected time constant for the first partial driver 136 has to already have elapsed. Likewise, for the voltage of the node A3 to drive partial driver 138 on, the selected time constant for the partial driver 137 has to have already elapsed. This delay is continued and is further increased, with each further partial driver that is added to the output of the driver signal.

In FIG. 2B, the sequential introduction of signal drivers of a first and second partial driver of the partial drivers 135 of FIG. 2B are in parallel to generate a selectable aggregate slew rate. In other words, the partial drivers 136 and 137 are introduced at a first time and a second time, respectively, after an application of a voltage to the first resistive element 250 of the partial driver 136, wherein the second time after the application of the voltage is greater than the first time after the application of the voltage. The resistive element 352 does not have a voltage gain until after an elapse of a selected time constant associated with node A1.

In the illustrated embodiment of FIG. 2A, each time-delay network 126-129 shares a common signal, which represents the targeted time constant. Therefore, each time-delay network 126-129 shares the same targeted time constant. Therefore, the introduction delay for each partial driver 136-139 should be substantially similar. The targeted time constant is variable and programmable. Therefore, the partial drivers 136-139 have a selectable aggregate slew rate that is programmable. Therefore, the signal driver 130 has a selectable slew rate that is programmable.

Figure 3A:
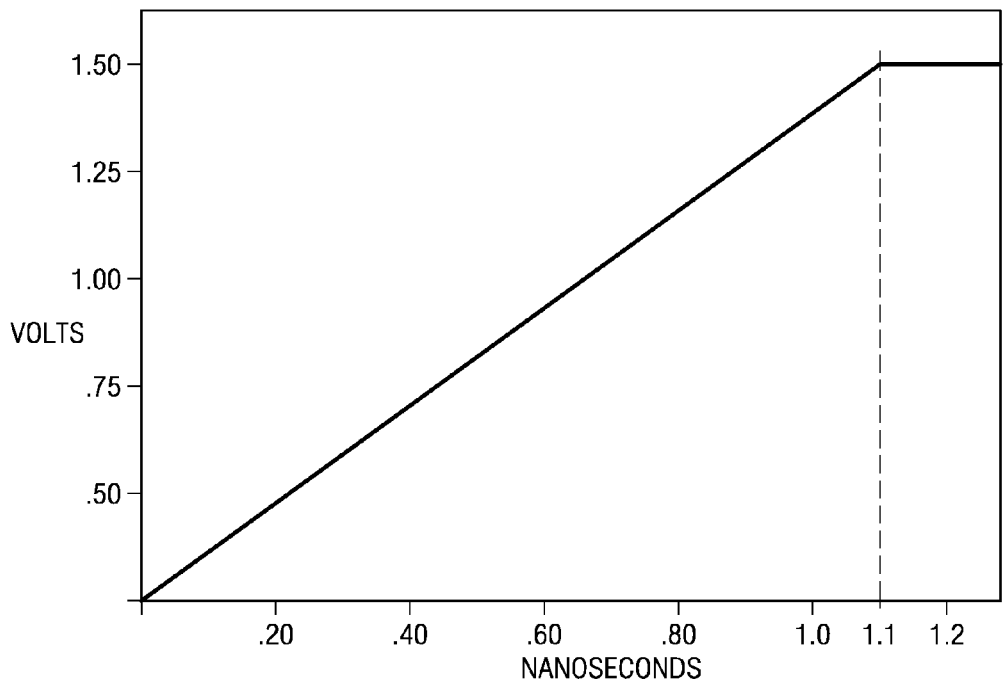
FIG. 3A illustrates a graph representing a slew rate of an enabled single partial driver (out of 20 total drivers), thereby creating an equivalent output turn-on resistance of 100 ohms.

FIG. 3A, illustrates a first slew rate for the signal driver 130, as discussed regarding FIG. 1. The signal driver 130 is set to have equivalent to 50 ohms turn-on resistance if all partial drivers 135 are enabled. The capacitance of the load 50 is 5 picofarads. However, in FIG. 3A, only a single driver 136 is turned on. Therefore, the signal driver 130 has 1000 ohm equivalent resistance. Given the formula given earlier, 10-90 Rise Time=2.2×Resistance×Capacitance; therefore, rise time is approximately $2.2 \times 1000 \times 5 \times 10^{-12} = 11 \times 10^{-9}$ seconds (11 nanoseconds).

Figure 3B:
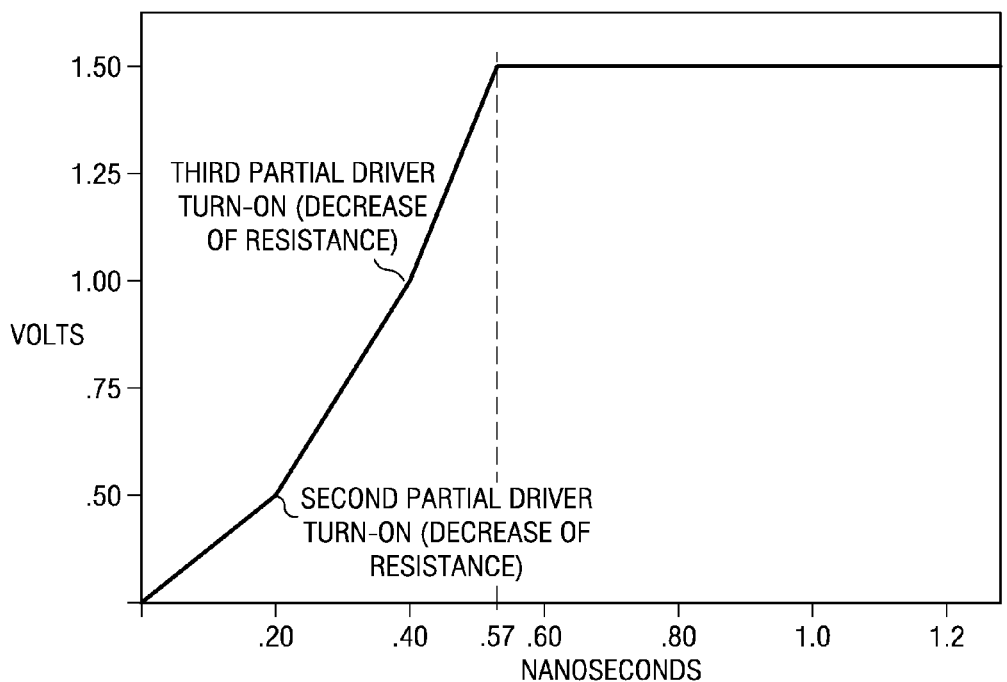
FIG. 3B illustrates a graph representing a change of an aggregate slew rate when first a single partial driver is enabled, then a second partial driver is enabled, then a third partial driver is enabled, out of 20 total partial drivers.

FIG. 3B illustrates an aggregate slew rate for the signal driver 130. As is illustrated, after the elapse of a targeted time constant, in this example 0.2 nanoseconds, each next sequential individual partial driver 136 to 138 is enabled. Here, to achieve an output of 1.5 volts by the signal driver 130, approximately 0.57 nanoseconds have elapsed. Therefore, in one embodiment, the signal driver 130 has an aggregate slew rate of 1.5 volts per 0.57 nanoseconds. In the illustrated aggregate slew rate, the signal driver 130 has 50 equivalent ohms if all partial drivers 135 are enabled.

Figure 4:
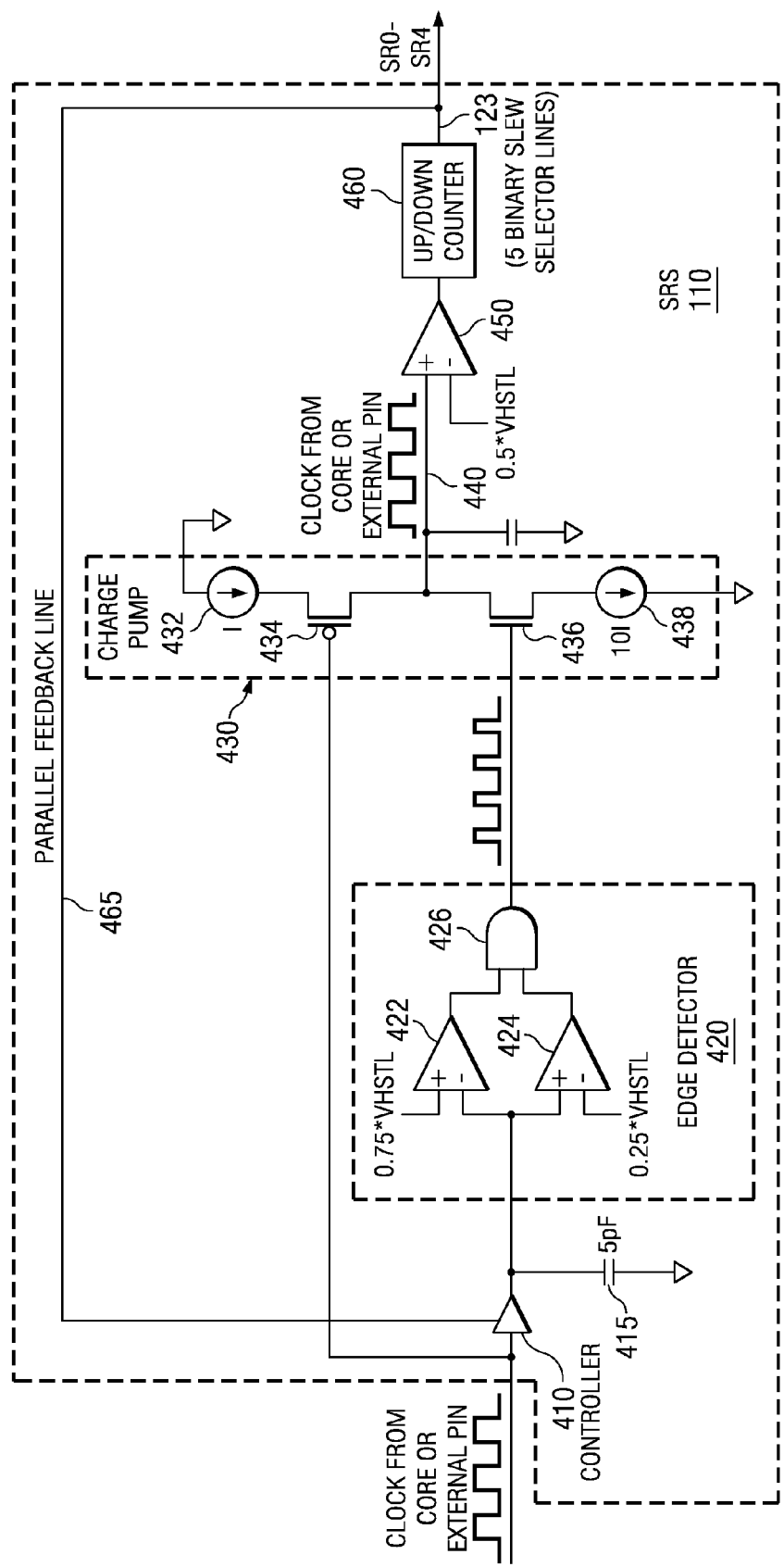
FIG. 4 illustrates a diagram of an embodiment of a slew rate selector that is employable for process voltage temperature (PVT) control through employment of a selectable aggregate slew rate.

FIG. 4 illustrates one embodiment of the SRS 110. Generally, the SRS 110 of FIG. 4 employs feedback and frequency division to help to affect the target time constant, in turn affecting an aggregate slew rate of the signal driver system 100.

In the SRS 110, a controller 410 receives both a clock signal and a slew rate control data from a parallel feedback line 465. Therefore, the controller 410 is driven "on", then "off," with an employment of a slew rate control data. In at least some embodiments, the slew rate control data is then also expressed as a target time constant conveyed to the partial drivers 136-139 etc. of FIG. 2B. The slew rate control data is then employed to generate the aggregate slew rate, wherein the aggregate slew rate is set as a fraction of a clock period of the clock signal.

The output of the controller 410 is coupled a grounding capacitor 415. In the illustrated embodiment, the grounding capacitor 415 is 5 picofarads. An effect of the grounding capacitor 415 is to slow the slew rate of 410 to an operational value.

The voltage across the grounding capacitor 415 is then conveyed to an edge detector 420. The edge detector 420 includes a first and second comparator 422, 424. The negative input of the comparator 422 is coupled to the cathode of the grounding capacitor 415, and the positive input of the comparator 422 is coupled to a voltage source that represents 75% of the maximum voltage rail of the controller 410. The positive input of the comparator 424 is coupled to the cathode of the grounding capacitor 415, and the negative input is coupled to a voltage source that represents 25% of the maximum voltage rail of the controller 410. The output of the comparators 422, 424 is conveyed to an AND gate 426 of the edge detector 420.

Generally, in the edge detector 420, when the received voltage signal is less than 75% of the maximum rail voltage ("0.75*VHSTL") of the controller 410, but greater than 25% of the maximum rail voltage ("0.25*VHSTL") of the controller 410, the edge detector 420 provides a "high" signal value. Otherwise, the edge detector 420 provides a "low" signal value.

As is illustrated, in some embodiments, the edge detector 420 provides a low signal value substantially longer than it does the high signal value. The comparative duty cycles of the low signal value and the high signal value is based on the capacitance of the grounding capacitor 415 and the parallel feedback line 465.

Both the output of the edge detector 420 and the clock signal from core or external pin are both conveyed to a change pump 430. Generally, a charge pump may be defined as a circuit that uses capacitors as energy storage elements to create either a higher or lower voltage reference. The charge pump 430 is coupled to an equivalent trickle current I source 432 when a field effect transistor ("FET") 434 is enabled, and has an equivalent drain current of 10 I 438 when a FET 436 is enabled. The trickle current I is enabled through a reception of the clock signal at the FET 434, and the equivalent current 10 I 438 is enabled by the output of edge detector 420 received at the FET 436. The current sources can be described as equivalent current sources.

Current sources 434 and 436 can both be on at the same time. The value of the equivalent 10 I 438 is set as a ratio of the on time of the output signal of the edge detector 420. As will be described below, the parallel feedback line 465 helps ensure that the target time constant of the controller PSS 120 is adjusted so that the SRS 110 eventually tracks the relative proportions and relationships between the clock signal and the output of the edge detector 420. The relative proportions and relationships between the clock signal and the output of the edge detector 420 may in turn be determined in order to set the selected aggregate slew rate.

In the SRS 110, an output of the charge pump 449 is coupled to a ground capacitor 440. The ground capacitor 440 is coupled to either a positive power rail or alternatively, ground, depending upon whether the FET 434 or the FET 436 is closed. The output of 440 is a slowly varying signal that may be one of a number of wave-shapes. The capacitor integrates the current. This signal is applied to a comparator 450 and is compared to half of the maximum rail voltage ("0.5*VHSTL") of the controller PRG 410. If for the majority of the time, the output of the cathode of the capacitor 440 is greater than 0.5*VHSTL, the output of the comparator 450 is positive; otherwise, the output is negative.

The output of the comparator 450 is then conveyed to an up/down counter 460. The counter 460 is clocked by a clock signal. In at least some embodiments, this clock signal is the same clock signal as received by the controller PSS 410. If the output of the comparator 450 is high, the output of the counter 460 increases. Otherwise, the output of the counter 460 decreases. The output of counter 460 is expressed as the data conveyed over the binary slew rate selector lines 123, individually referred to as SR0-SR4.

Any data, correlated to the target time constant, conveyed over SR0-SR4 is also conveyed over a parallel feedback line 465 to the controller 410.

Increasing or decreasing the targeted slew rate will affect the slew rate of the controller 410, and therefore the length of time for which the edge detector 429 outputs a "high" or "low" signal. The "high" or "low" signal in turn determines the amount of time the FET 436 of the charge pump 430 is to be open or shut, which in turn eventually effects whether the counter 460 further increases or decreases.

In other words, the signals conveyed over SR0-SR4 to the signal driver 130, corresponding to the target time constant, are affected by the trigger thresholds of the edge detector 420. Should the up/down counter 460 stray substantially from a value that is associated with the target time constant, (which is in turn associated with the aggregate slew rate of the signal driver 100,) a progress or a retardation of the voltage output of the controller 410 occurs, eventually causing the counter 460 to compensate, perhaps reversing direction. This compensation adjusts the data to more closely emulate a desired edge rate, which may be expressed as a function of a targeted time constant, as conveyed by the comparative values provided to the edge detector 420, i.e., the slew rate control data. In some embodiments, the clock signal received at the controller 410 and the counter 460 is substantially faster than the driver on the signal 124.

Figure 5:
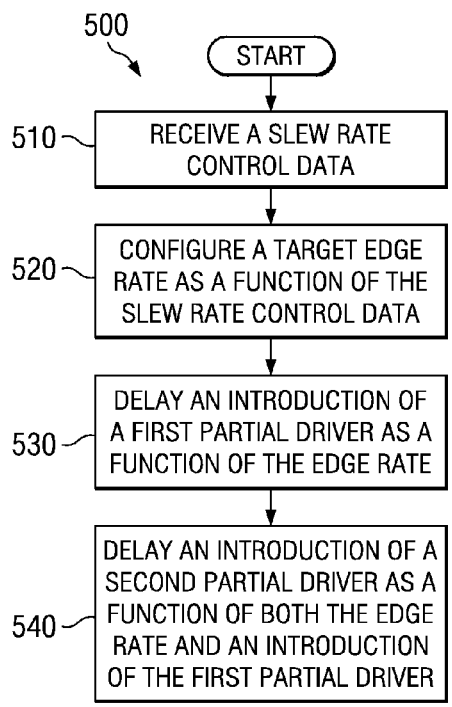
FIG. 5 illustrates a diagram of an embodiment of a method of operating an aspect of a signal driver of FIG. 1 having a selectable aggregate slew rate.

FIG. 5 illustrates a method 500. In step 510, slew rate control data is received. In step 520, a target time constant, which is used to express an edge rate, is configured as a function of the slew rate control data, which is used to express the target time constants of employed within FIG. 2B. This can occur, for instance, in the time delay networks 125. In step 530, an introduction of a first partial driver, such as the partial driver 136, is delayed as a function of the edge rate. In step 540, an introduction of a partial driver, such as a second partial driver 137, is delayed as a function of both the edge rate and an introduction of the first partial driver, such as partial driver 136.

In some embodiments of method 500, an output driver signal of a partial driver, such as partial driver 137, is delayed as a function of the target time constant. The target time constant can be a function of a resistance of a resistive element and a reactance of a time-delay network associated with the first partial driver, such as partial driver 136. In the method 500, delaying the output driver signal of a partial driver, such as partial driver 136, may delay the introduction of the second partial driver, such as partial driver 137. In some embodiments of the method 500, the slew rate control data is adjusted as a function of a signal received from a feedback loop.

Those skilled in the art to which the invention relates will appreciate that other and further additions, deletions, substitutions and modifications may be made to the described embodiments without departing from the scope of the invention.

What is claimed is:

1. A signal driver having a configurable slew rate, comprising:
   plural partial drivers configured to generate drive signals based on time constants established by corresponding plural time-delay networks associated therewith, the plural time-delay networks comprising a tapped RC delay line; and
   a slew rate selector coupled to said plural time-delay networks and configured to provide a common signal thereto to cause said plural time-delay networks to achieve target time constants, said target time constants causing said partial drivers to be generated such that said signal driver achieves said selectable aggregate slew rate, wherein said slew rate selector couples said common signal to a first tap on said tapped RC delay line, said first tap being coupled to an input of a first of said plural partial drivers, said common signal being coupled to a second of said plural partial drivers via a second tap on said tapped RC delay line, whereby said common signal coupled to said second of said plural partial drivers is delayed by delay of said first tap plus delay between said first and second taps.

2. The signal driver as recited in claim 1 wherein a second partial driver of said plural partial drivers is introduced after an introduction of a first partial driver of said plural partial drivers.

3. The signal driver as recited in claim 1 wherein said a second partial driver of said plural partial drivers is introduced after a time segment comprising both a first target time constant and a second time constant of said target time constants.

4. The signal driver as recited in claim 3, wherein said first target time constant and said second target time constant are a same value target time constant.

5. The signal driver as recited in claim 1, further comprising a resistive element of a first time-delay network of said plural time-delay networks, wherein a second partial driver of said plural partial drivers is introduced after a rise of a voltage introduced to said resistive element of said first time-delay network.

6. The signal driver as recited in claim 5 wherein said resistive element is also coupled to a prior resistive element.

7. The signal driver as recited in claim 1 wherein said target time constants are the same target time constant.

8. The signal driver as recited in claim 1 wherein a selection of said common signal occurs due to a digital programming of said slew rate selector.

9. The signal driver as recited in claim 1 wherein a first time-delay network of said plural time-delay networks is coupled to a second time-delay circuit of said plural time-delay networks.

10. A signal driver having a configurable slew rate, comprising:
    plural partial drivers configured to generate drive signals based on time constants established by corresponding plural time-delay networks associated therewith;
    a slew rate selector coupled to said plural time-delay networks and configured to provide a common signal thereto to cause said plural time-delay networks to achieve target time constants, said target time constants causing said partial drivers to be generated such that said signal driver achieves said selectable aggregate slew rate,
    wherein said common signal is modified by a feedback loop.

11. A signal driver system having a signal driver with a selectable aggregate slew rate, comprising:
    plural partial drivers configured to generate drive signals based on time constants established by corresponding plural time-delay networks associated therewith; and
    a slew rate selector coupled to said plural time-delay networks and configured to provide a common signal thereto to cause said plural time-delay networks to achieve target time constants, said target time constants causing said partial drivers to be generated such that said signal driver achieves said selectable aggregate slew rate, a first time-delay network of said plural time-delay network including:
        at least one switch,
        at least one capacitor, wherein said capacitor is grounded if said switch is closed, and
        a resistive element coupled to a sensor of a partial driver of said plural partial drivers and also to said at least one capacitor, wherein said resistive element is also coupled to a prior resistive element, each of said target time constants being based on said prior resistive element and a closure state of said switch.

12. The signal driver as recited in claim 11 wherein each of said target time constants is employable to vary an introduction time of its respective partial driver to vary the aggregate slew rate.

13. The signal driver as recited in claim 11 wherein said first time-delay network further comprises:
    a plurality of switches; and
    a plurality of capacitors, each of said plurality of capacitors being grounded by a corresponding switch of said plurality of switches when said corresponding switch is closed, said first variable time constant being based on said prior resistive element and a closure state of said corresponding switch.

14. The signal driver as recited in claim 13 wherein said plurality of capacitors is coupled in parallel to one another when all of said switches are closed.

15. The signal driver as recited in claim 13 wherein said plurality of capacitors has a first capacitor and a second capacitor, and wherein said second capacitor has substantially twice the capacitance of the first capacitor.

16. The signal driver as recited in claim 13 wherein a second time-delay network of said plural time-delay network comprises:
   at least one switch;
   at least one capacitor, wherein said at least one capacitor is grounded if said switch is closed; and
   a resistive element coupled to an input of said second signal slice and also to said at least one capacitor, said resistive element coupled to said resistive element of said first time-delay network.

17. The signal driver as recited in claim 11 wherein a driver signal of a first and second partial driver of said plural driver networks are in series to generate said aggregate slew rate.

18. The signal driver as recited in claim 17 wherein said first and second partial drivers are introduced at a first time and a second time, respectively, after an application of a voltage to the first resistive element of said first time-delay network, wherein said second time after said application of said voltage is greater than said first time after said application of said voltage.

19. A method of controlling an aggregate slew rate, comprising:
   receiving slew rate control data;
   configuring a target edge rate as a function of said slew rate control data;
   delaying an introduction of a first partial driver as a function of said target time constant; and
   delaying an introduction of a second partial driver as a function of both said target edge rate and an introduction of said first signal slice;
   further comprising delaying an output driver signal as a function of said target time constant, said target time constant a function of a resistance of a resistive element and a reactance of a time-delay network associated with said first partial driver, wherein delaying said output driver signal delays said introduction of said first partial driver and adjusting said slew rate control data as a function of a signal received from a feedback loop.

20. The method as recited in claim 19, wherein controlling said aggregate slew rate is a function of an equivalent resistance of said first and second partial drivers.

21. The method as recited in claim 19, wherein said target edge rate is a function of a target time constant.

* * * * *